United States Patent [19]
Yamauchi et al.

[11] Patent Number: 4,904,888
[45] Date of Patent: Feb. 27, 1990

[54] SENSE AMPLIFIER CIRCUIT

[75] Inventors: Hiroyuki Yamauchi, Hirakata; Toshio Yamada, Sakai, both of Japan

[73] Assignee: Matsushita Electric Industrial Co., Ltd., Osaka, Japan

[21] Appl. No.: 253,216

[22] Filed: Oct. 3, 1988

[30] Foreign Application Priority Data

Oct. 2, 1987 [JP] Japan .................................. 62-250128

[51] Int. Cl.[4] ........................ H03K 5/24; H03K 3/013; G11C 11/40; G11C 7/00
[52] U.S. Cl. ................................. 307/530; 307/303.2; 307/482; 307/578; 365/189.07; 365/208
[58] Field of Search ............... 307/530, 482, 578, 279, 307/360, 362, 363, 482.1, 303.2; 365/205, 207, 208, 189.07

[56] References Cited

U.S. PATENT DOCUMENTS

| | | | |
|---|---|---|---|
| 4,482,825 | 11/1984 | Nozaki et al. | 307/530 X |
| 4,769,564 | 9/1988 | Garde | 307/279 X |
| 4,802,130 | 1/1989 | Soneda | 365/205 |
| 4,825,417 | 4/1989 | Seo | 365/208 X |
| 4,829,478 | 5/1989 | Hashimoto | 307/530 X |

Primary Examiner—John S. Heyman
Assistant Examiner—David R. Bertelson
Attorney, Agent, or Firm—Wenderoth, Lind & Ponack

[57] ABSTRACT

In order to enhance the sensitivity of a sense amplifier circuit, each one of the transistor pair composing the sense amplifier circuit is formed by transistors connected parallel in an even number of stages, and therefore the sense amplifier circuit is made of transistor pair having an extremely balanced characteristic, cancelling the asymmetricity of current-voltage characteristic of the transistor pair to null.

2 Claims, 5 Drawing Sheets

FIG. I
PRIOR ART
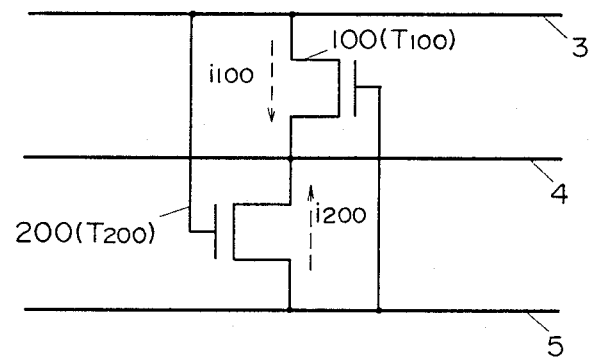
FIG. 2
PRIOR ART
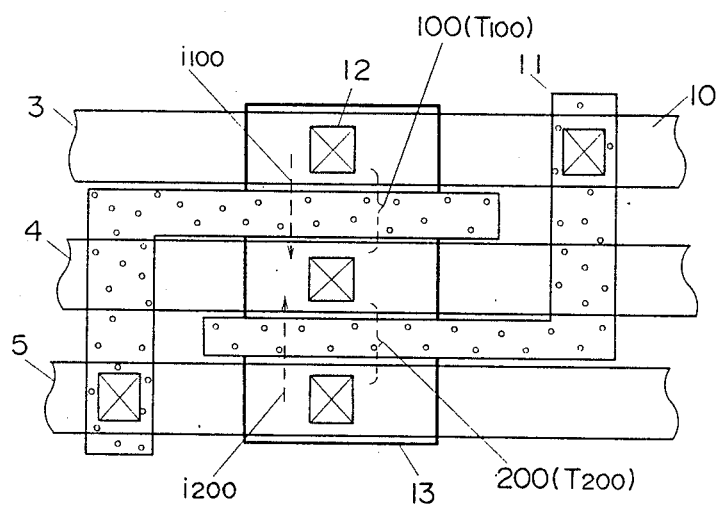

SENSE AMPLIFIER CIRCUIT

BACKGROUND OF THE INVENTION

This invention relates to a sense amplifier circuit used in dynamic RAM, static RAM, etc.

A conventional latch type sense amplifier circuit is explained by referring to FIGS. 1 and 2. FIG. 1 is an equivalent circuit diagram of a conventional latch type sense amplifier circuit, in which numerals 100 and 200 are respectively first N-type transistor (hereinafter called T100) and second N-type transistor (T200). Numerals 3 and 5 are bit wire pair, and 4 is an earth wire. In the equivalent circuit shown in FIG. 1, the operation of amplifying the potential difference V of the bit wire 3 and bit wire 5 by the sense amplifier circuit is as follows. First, taking notice of T100 and T200, since the sources are commonly connected to the earth wire, the difference between the gate-source voltage applied to T100 (hereinafter called $V_{gs1}$) and the gate-source voltage applied to T200 ($V_{gs2}$) is as expressed below:

$$\Delta V = |V_{gs1} - V_{gs2}| \ldots \quad (1)$$

That is, the potential difference of bit wire pair 3, 5 is the difference of the gate-source voltage applied to $T_{100}$, $T_{200}$, which is also the difference of currents $i_{100}$, $i_{200}$ flowing in $T_{100}$, $T_{200}$. As the currents $i_{100}$, $i_{200}$ flow, since these are discharge currents for discharging the electric charge of the bit wires to the earth wire, the potential of bit wire 3 $V_{bit}$ and the potential of bit wire 5 $V_{bit}$ decrease by the portions shown below.

$$\Delta V_{bit} = \frac{i_1 \cdot t}{c_3} \quad (2)$$

$$\Delta V_{bit} = \frac{i_2 \cdot t}{c_5} \quad (3)$$

where t is the discharge time, and $c_3$, $c_5$ are capacities of bit wires. From the relationship of equations (1), (2), (3), and the relation of $\Delta V_{bit} = \Delta V_{gs2}$, $\Delta V_{bit} = \Delta V_{gs1}$, evidently a positive feedback is applied to the potential difference of the bit wire pair 3, 5, and the potential difference is amplified.

One of the important factors to determine the performance of the sense amplifier operating in such manner is the sensitivity. This is to show the smallest limit of potential difference that can be amplified correctly, and the minimum potential difference is called the sensitivity. As stated above, the potential difference of the bit wire pair is the gate-source voltage of MOS transistors $T_{100}$, $T_{200}$ and also becomes the potential difference flowing in the transistors, and this potential difference expands the potential difference of bit wire pair, and hence the following point is important. The point is whether the small gate-source voltage difference (the difference of $V_{gs1}$ and $V_{gs2}$) is correctly obtained as the difference of currents (the difference of $i_{100}$ and $i_{200}$) or not. That is, if $V_{gs1} > V_{gs2}$, however small the difference may be, the relation of $i_{100} > i_{200}$ must be satisfied. To realize this, it is necessary that the threshold voltage and drivabilities gm of MOS transistors $T_{100}$, $T_{200}$ be exactly the same.

In order to realize such relations, conventionally, a sense amplifier circuit was realized in the wiring and layout as shown in FIG. 2. This is a layout drawing of an actual sense amplifier circuit. This layout is replaced by an equivalent circuit diagram in FIG. 1. As evident from this drawing, the currents $i_{100}$, $i_{200}$ flow in the reverse directions geometrically on the wafer, that is, a semiconductor integrated circuit board.

The sense amplifier circuit of N-type MOS transistors was explained in FIGS. 1 and 2, but the P-type configuration is exactly the same except that the earth wire 4 is Vcc wire, that the MOS transistors 100, 200 are P-type MOS transistors, and that the current directions of both $i_{100}$ and $i_{200}$ are reverse.

However, in the sense amplifier circuit as shown in FIGS. 1, 2, the following problems exist because the current $i_{100}$ flowing in the MOS transistor $T_{100}$ and the current $i_{200}$ flowing in the MOS transistor $T_{200}$ are opposite.

First of all, generally, when forming source and drain of MOS transistor, the ion beam is designed to reach the wafer at a certain angle in order to prevent channeling of ions. Therefore, the overlapping amount of the gate electrode and source region or drain region is asymmetric in the source region and drain region. This tendency becomes more obvious when the angle of the ion beam is deviated more from the angle perpendicular to the wafer surface, or the ratio of thickness to width of gate electrode (aspect ratio = thickness/width) becomes larger. This asymmetricity is considered to be caused, aside from the formation of source and drain, by injection of ions for channel stop of source and drain, asymmetricity of shape of the gate electrode to become injection mask, and asymmetricity of the shape of gate side oxide spacer. This tendency is considered to be intensified as the gate length and gate width become smaller, and this problem is a must to be solved in the fine MOS transistors used in large-scale integrated circuit.

Incidentally, when asymmetricity occurs in the ion injection quantity of source and drain, another asymmetricity will naturally occur in the current-voltage characteristic. In other words, even in a same transistor, the threshold voltage and drivability gm come to have different values depending on the direction of the flowing current. Thus, as explained in the prior art, in the sense amplifier circuit as shown in FIG. 1, even if it is designed so that the $T_{100}$ and $T_{200}$ may have identical threshold voltage and drivability gm, since the directions of the flowing currents are reverse, it is possible, owing to the asymmetricity of the current-voltage characteristic, that the discharge current may be possibly greater in the current $i_{200}$ flowing in $T_{200}$ than the current $i_{100}$ flowing in $T_{100}$ if the drivability gm is greater in $T_{200}$ than in $T_{200}$ although the gate voltage $V_{gs1}$ of $T_{100}$ is greater than gate voltage $V_{gs2}$ of $T_{200}$. Therefore, the small potential difference of the bit wire pair 3, 5 is not amplified correctly, and the potential of the bit wire 5 giving $V_{gs1}$ is smaller than the potential of the bit wire 3 giving $V_{gs2}$, and the sense amplifier circuit may malfunction.

By the sensitivity S of the sense amplifier and reading from the memory cell, the difference from the potential difference $\Delta V$ occuring in the bit wire pair 3, 5, that is, M in $M = \Delta V - S$, is called a margin. The value of M seems to be much smaller because the reading voltage $\Delta V$ tends to be smaller along with the increase of bit wire capacity and decrease of cell capacity by high integration of memory cell. Hence, higher sensitivity of the sense amplifier circuit is more and more needed. It is therefore important to equalize the threshold voltage and drivability gm of the transistor pair $T_{100}$, $T_{200}$ of the sense amplifier circuit, in consideration of the current direction. In the conventional sense amplifier circuit and layout, however, since the current directions of $T_{100}$, $T_{200}$ are opposite, the asymmetricity of the current-voltage characteristic due to asymmetricity of feeding amounts of source and drain has a considerable effect, and the sensitivity of the sense amplifier tends to worsen.

SUMMARY OF THE INVENTION

It is hence a primary object of this invention to present a high sensitivity sense amplifier circuit capable of suppressing the asymmetricity of the current-voltage characteristic of transistor pair composing the sense amplifier.

To achieve the above object, the sense amplifier circuit of this invention is composed by coupling the first bit wire coupled to the memory cell and the drain part of first MOS transistor, coupling the second bit wire making a pair with the first bit wire and the gate part of the first MOS transistor, coupling the drain part of second MOS transistor and the second bit wire, coupling the gate part of the second MOS transistor and the first bit wire, coupling the source parts of the first and second MOS transistors commonly to a power source wire, and forming both first MOS transistor and second MOS transistor, out of the N-type of P-type MOS transistors composing the latch type sense amplifier circuit, by a plurality of N-type or P-type MOS transistors connected in series.

While the novel features of the invention are set forth in the appended claims, the invention both as to organization and content, will be better understood and appreciated, along with other objects and features thereof, from the following detailed description taken in conjunction with the drawings.

BRIEF DESCRIPTION OF THE DRAWINGS

FIG. 1 is an equivalent circuit diagram of a conventional sense amplifier;

FIG. 2 is a mask pattern showing the layout of the same circuit;

DETAILED DESCRIPTION OF THE INVENTION

Of the two N-type MOS transistor circuits making up a pair to compose a sense amplifier circuit, both first MOS transistor circuit and second MOS transistor circuit are composed of N-type MOS transistors connected parallel in an even number of stages, and the discharge current flowing in the earth wire from the parallel connection circuit of an even number of stages composing the first MOS transistor is presented by the even number of stages. These currents are supposed to be $i_{11}, i_{12}, i_{13}, ....., i_{1n}$. Similarly, the discharge currents flowing in the earth wire from the parallel connection circuit of an even number of stages composing the second MOS transistor circuit are $i_{21}, i_{22}, i_{23}, ....., i_{2n}$. Here n is an even number.

Supposing, for example, n=2, $i_{11}$ and $i_{12}$ are the currents flowing in the first MOS transistor circuit, and the sum of the currents flowing from bit wires into the earth wire is $i_{11}+i_{12}$. Likewise, the currents flowing in the second MOS transistor circuit is $i_{21}$ and $i_{22}$, and the sum of the currents flowing from bit wires into the earth wire is $i_{21}+i_{22}$. The geometrical relation of current directions of $i_{11}$, $i_{12}$, $i_{21}$, $i_{22}$ on the wafer, that is, the semiconductor circuit board is as follows.

$i_{11}$ and $i_{22}$ are in same direction . . .  (4)

$i_{12}$ and $i_{21}$ are in same direction . . .  (5)

$$\left\{ \begin{matrix} i_{11} \text{ and } i_{12} \\ i_{22} \text{ and } i_{22} \end{matrix} \right\} \text{are in opposite directions} \quad (6)$$

From the relation of (4), (5), (6), if the threshold voltage and drivability gm become asymmetric due to the current direction because of the asymmetricity of source and drain, when $(i_{11}+i_{12})$ and $(i_{21}+i_{22})$ are compared, if asymmetricity of $i_{11}$ and $i_{21}$, and assymetricity of $i_{12}$ and $i_{22}$ should occur, they are canceled to null on the whole.

Thus, if the first MOS transistor and second MOS transistor circuits are both composed in parallel connection of an even number of stages, if there is asymmetricity in one pair of transistors, the asymmetricity is canceled to null in the even number pair of transistors.

Figure 3:
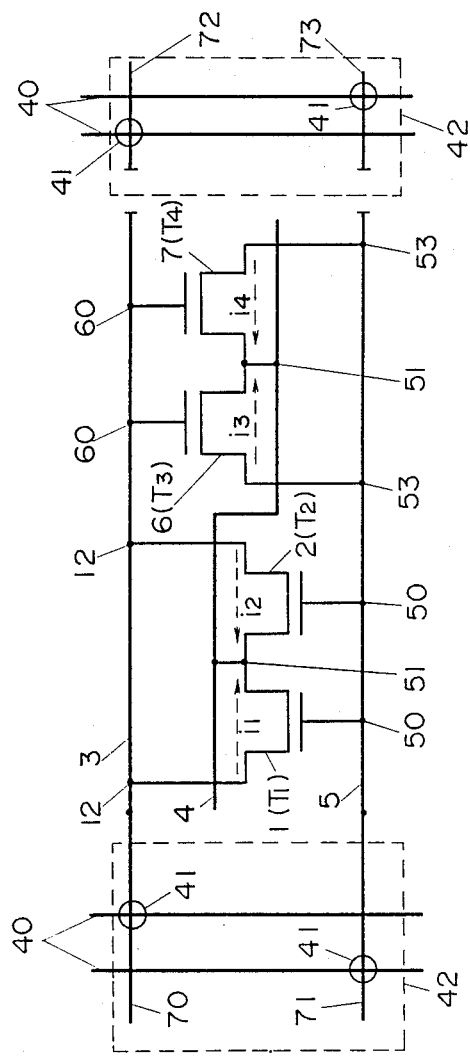
FIG. 3 is an equivalent circuit diagram of a sense amplifier circuit in a first embodiment of this invention.
Figure 4:
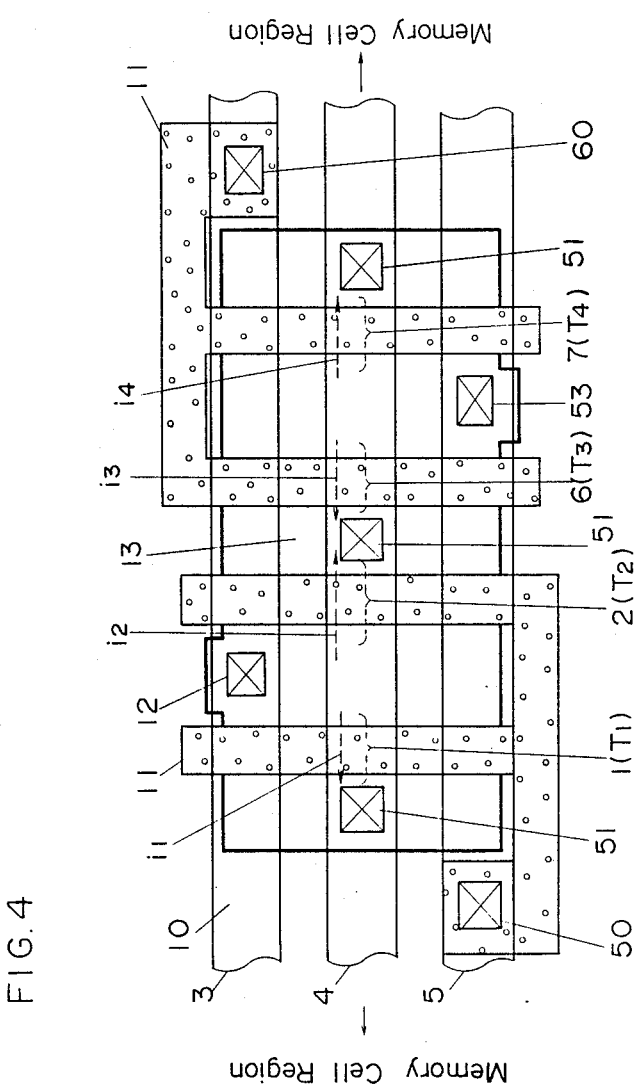
FIG. 4 is a mask pattern diagram showing the layout of the same circuit.

FIG. 3 and FIG. 4 show an equivalent circuit and its layout diagram of a sense amplifier circuit in one of the embodiments of this invention.

First relating to the equivalent circuit diagram of the sense amplifier circuit shown in FIG. 3, numerals 1, 2 are first N-type MOS transistor circuits connected in parallel, 6, 7 are second N-type MOS transistor circuits connected in parallel, and these first and second N-type MOS transistor circuits are making up a transistor pair. Numerals 3, 5 are bit wire pair, and 4 is an earth wire. FIG. 4 shows a mask drawing of an actual layout of the circuit diagram of sense amplifier shown in FIG. 3, that is, a semiconductor integrated circuit pattern formed on a semiconductor substrate. Numeral 10 is an aluminum used in wiring, and 11 is a polysilicon used in gate electrode, 12 is a contact region for connecting the drain region of MOS transistors 1, 2 and bit wire 3, 13 is an active region of transistor in oxide definition (OD), that is, an inseparate region, 50 is a contact region of gate electrode of MOS transistors 1, 2 and bit wire 5, 51 is a contact region for connecting the common source region of MOS transistors 1, 2 and 3, 4, and earth wire 4, 53 is a contact region for connecting the drain region of MOS transistors 6, 7, and bit wire 5, 60 is a contact region for connecting gate electrode of MOS transistors 6, 7 and bit wire 3, and 42 is a memory cell region disposed at both sides of the sense amplifier circuit, 40 being word wire and 41 being memory cell.

In FIG. 3, the bit wires 70, 71 in the left side memory cell region are connected to bit wires 3, 5, respectively. But the bit wires 72, 73 in the right side memory cell are not connected to 3, 5.

Regarding the currents in the sense amplifier circuit, as shown in FIG. 3, currents flowing in transistors 1, 2, 6, 7 (hereinafter called $T_1$, $T_2$, $T_6$, $T_7$) are considered. The current $i_1$ flowing in $T_1$ and the current $i_3$ flowing in T₃ are geometrically same in direction on the wafer, and the i₂ flowing in T₂ and the current i₄ flowing in T₄ are same in direction. The transistors 1, 2, 6, 7 are designed to have same channel length and channel width, and the manufacturing conditions are also same. Accordingly, the current-voltage characteristics of transistors 1, 2, 6, 7 are considered to show an asymmetricity of source and drain, that is, same characteristics except in the geometrical current direction on the wafer.

The effects of this embodiment are described below.

In the embodiment of this invention shown in FIGS. 3, 4, taking note of the sum of currents $(i_1+i_2)$ flowing in $T_1$, $T_2$ composing the first N-type MOS transistor circuit of the transistor pair of the sense amplifier circuit, and the sum of currents $(i_3+i_4)$ flowing in $T_3$, $T_4$ composing the second N-type MOS transistor circuit, $i_1$ and $i_3$ are currents in the same direction, and same characteristics are shown. Besides, since $i_2$ and $i_4$ are same in direction, it is considered that same characteristics are shown, and the entire current-voltage characteristics, that is, the current-voltage characteristics of $(i_1+i_2)$ and $(i_3+i_4)$ are canceled in the asymmetricity due to current direction and are considered to have same characteristics, which makes it possible to enhance the sensitivity of sense amplifier circuit.

According to this invention, since both the first and second MOS transistors of the N-type or P-type MOS transistor pair to compose a latch type sense amplifier circuit are made of N-type or P-type MOS transistors connected parallel in an even number of stages, when even-number currents flowing in the first MOS transistor circuit and the even-number currents flowing in the second MOS transistor circuit are compared, the current in the same direction geometrically in the wafer as the current flowing in the first MOS transistor circuit flows also in the second MOS transistor circuit, and therefore, on the whole, the current-voltage characteristics of the sum of currents flowing in the first MOS transistor circuit and the sum of currents flowing in the second MOS transistor circuit are canceled in the asymmetricity due to the direction of individual currents to become identical in characteristics, so that the sensitivity of the sense amplifier circuit may be increased.

Figure 5A:
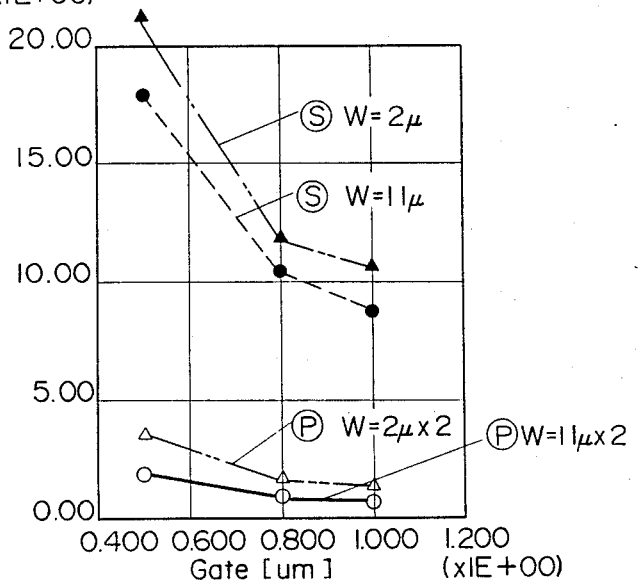
FIG. 5(a–b) is a diagram comparing the imbalance of the transistor pair in this invention with the imbalance of the transistor pair in the prior art as indicated by measured values.
Figure 5B:
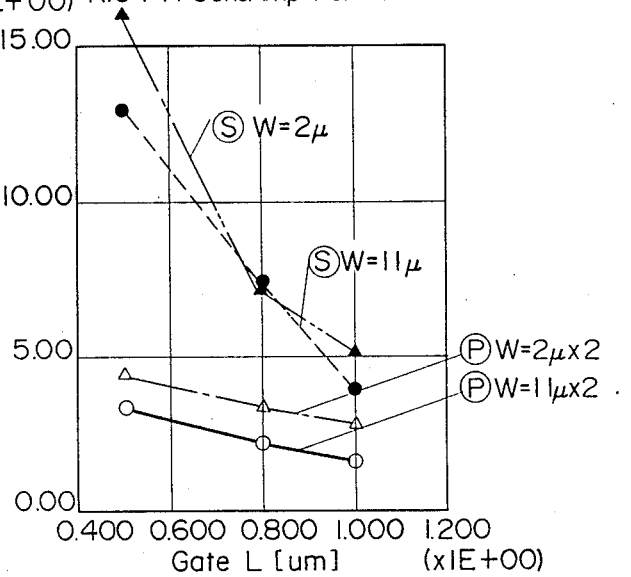

FIG. 5 shows the asymmetricity of the current-voltage characteristic of the transistor pair composing a sense amplifier circuit experimentally fabrication in order to verify this invention, in which (a) shows the asymmetricity of threshold voltage, and (b) indicates the asymmetricity of drain current. Here, the asymmetricity is defined as follows.

$$\text{Asymmetricity:} \quad \Delta Vth = \frac{Vth_1 - Vth_2}{Vth_1} \times 100\%$$

$$\Delta Ids = \frac{Ids_1 - Ids_2}{Ids_1} \times 100\%$$

where $\Delta Vth$ is the asymmetricity of threshold voltage, $\Delta Ids$ is the asymmetricity of drain current, $Vth_1$, $Vth_2$ are threshold voltage of pair transistors, and $Ids_1$, $Ids_2$ are drain currents of pair transistors.

In diagrams (a) and (b), S is a series connection which corresponds to the prior art, and P is a parallel connection which corresponds to the transistor pair characteristic of this invention. Whether the transistor gate width W is $2\mu$ or $1\mu$, and if the gate length is in a range of 0.5 to 1.0 $\mu$m, it is known that the asymmetricity of transistor pair in this invention is obviously small. This is because of the reason stated above, and it proves the efficacy of this invention.

Figure 6:
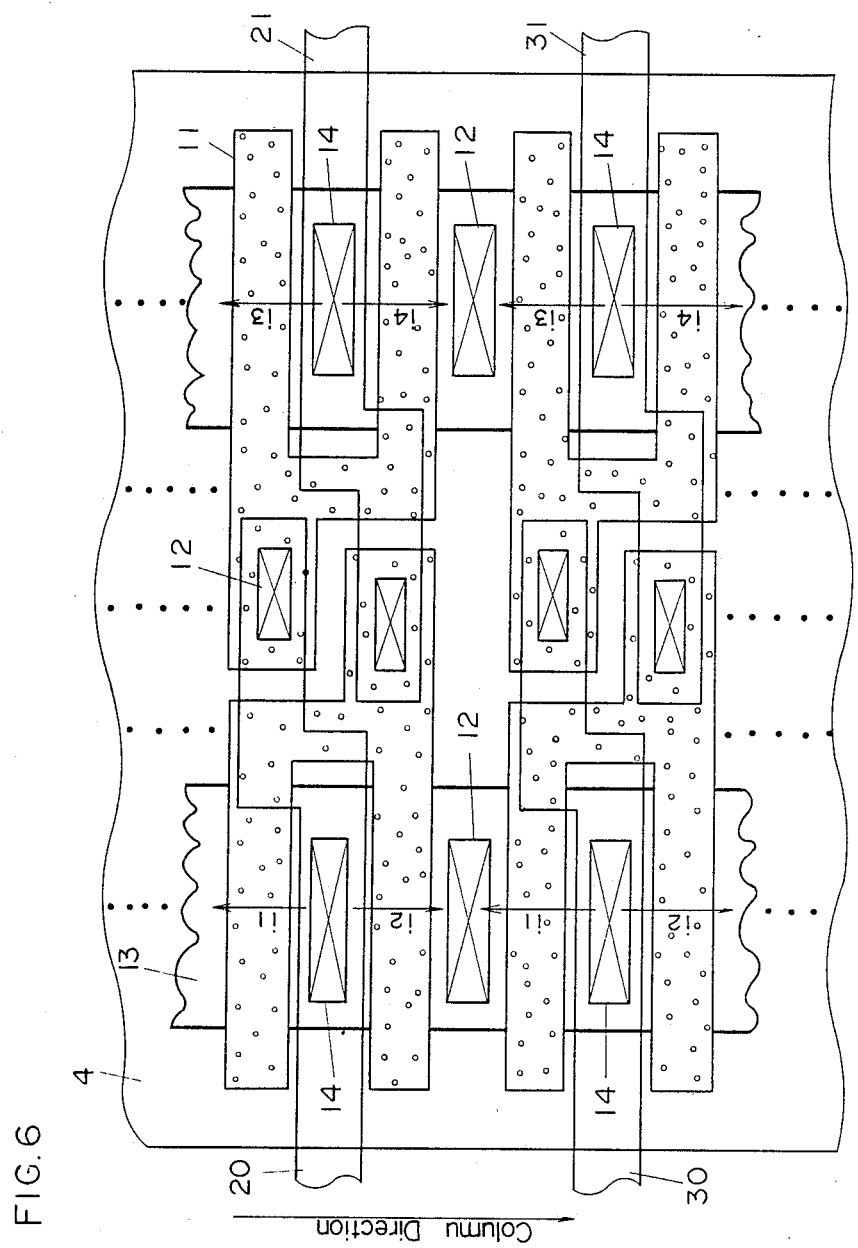
FIG. 6 is a mask pattern diagram showing the layout of a second embodiment of this invention.

A second embodiment is shown in FIG. 6, in which is an earth wire made of aluminum (AL), 20, 21, 30, 1 are bit wires made of polycide (PB), 13 is OD (oxide definition inseparable region), 12 is a contact between AL and OD, and 14 is a contact between PB and OD.

The features of the sense amplifier circuit shown in this drawing include, aside from the composition of transistor pair for composing the sense amplifier circuit by transistors connected parallel in an even number of stages (two stages) same as in the first embodiment, the continuity of the inseparable region OD to form transistors, without an intervening separate region, in the bit wire arranging direction, that is, in the column direction. This is realized because the common source region of the transistor pair adjacent in the column direction, that is, the OD region having the earth wire 4 connected by means of contact 12 is shared by the transistor pair adjacent at both sides in the column direction. By this configuration, the separate region between the transistor pair adjacent in the column direction which was required conventionally is no longer necessary, and the layout area of the sense amplifier can be reduced. A further greater advantage is that the drop of yield of the sense amplifier circuit attributable to incompleteness (leak current) of separation of the transistor pair adjacent in a narrow limited space can be reduced.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A sense amplifier circuit comprising first and second bit wires coupled to a memory cell, a first MOS transistor having a drain connected to said first bit wire, said second bit wire is coupled to the gate of the first MOS transistor, a second MOS transistor having a drain connected to said second bit wire, and either an N-type a P-type MOS transistor pair to compose a latch type sense amplifier circuit by coupling the gate of the second MOS transistor and the first bit wire, and coupling the sources of the first and second MOS transistors commonly to a power source wire, wherein both first and second MOS transistors are composed of a plurality of either N-type or P-type MOS transistor connected in parallel.

2. A sense amplifier circuit comprises forming first and second MOS transistors of a transistor pair in the same region as the first MOS transistor of the transistor pair at both sides adjacent in the column direction, and also forming the second MOS transistor in the same region as the second MOS transistor of the pair of transistors at both sides adjacent in the column direction.

* * * * *